(12) United States Patent
Wada et al.

(10) Patent No.: US 9,117,851 B2
(45) Date of Patent: Aug. 25, 2015

(54) SEMICONDUCTOR DEVICE COMPRISING A GRAPHENE WIRE

(71) Applicant: KABUSHIKI KAISHA TOSHIBA, Minato-ku, Tokyo (JP)

(72) Inventors: Makoto Wada, Yokohama (JP); Yuichi Yamazaki, Inagi (JP); Akihiro Kajita, Yokohama (JP); Atsunobu Isobayashi, Yokohama (JP); Tatsuro Saito, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 197 days.

(21) Appl. No.: 13/846,850

(22) Filed: Mar. 18, 2013

(65) Prior Publication Data

US 2014/0084250 A1 Mar. 27, 2014

(30) Foreign Application Priority Data

Sep. 21, 2012 (JP) ................................. 2012-208669

(51) Int. Cl.
| | |
|---|---|
| H01L 29/06 | (2006.01) |
| H01L 29/66 | (2006.01) |
| B82Y 30/00 | (2011.01) |
| H01L 23/532 | (2006.01) |
| C01B 31/04 | (2006.01) |

(52) U.S. Cl.
CPC ............ *H01L 29/66977* (2013.01); *B82Y 30/00* (2013.01); *H01L 23/53276* (2013.01); *C01B 31/0453* (2013.01); *H01L 2924/0002* (2013.01); *Y10S 977/734* (2013.01); *Y10S 977/932* (2013.01)

(58) Field of Classification Search
CPC .................................................... C01B 31/0469
USPC ................. 257/29; 423/445 R, 448; 427/228, 427/249.6; 438/903; 977/734
See application file for complete search history.

(56) References Cited

U.S. PATENT DOCUMENTS

| | | | |
|---|---|---|---|
| 8,337,949 B2 * | 12/2012 | Choi et al. ..................... | 427/227 |
| 2007/0001283 A1 * | 1/2007 | Laska et al. .................... | 257/692 |

(Continued)

FOREIGN PATENT DOCUMENTS

| | | |
|---|---|---|
| JP | 2006-272491 A | 10/2006 |
| JP | 4512176 B2 | 7/2010 |

(Continued)

OTHER PUBLICATIONS

Loginova, E. et al. Factors influencing graphene growth on metal surfaces. New J Phys, 11, 063046. (2009).*
O'Brien, P. et al. Imaging of curved facet unstable resonator semiconductor lasers operating at 980nm. Electron Lett, 34, 6, 561-562. (1998).*

(Continued)

*Primary Examiner* — Thao X Le
*Assistant Examiner* — Gardner W Swan
(74) *Attorney, Agent, or Firm* — Holtz, Holtz, Goodman & Chick PC

(57) ABSTRACT

According to one embodiment, a semiconductor device includes a catalyst underlying layer formed on a substrate including semiconductor elements formed thereon and processed in a wiring pattern, a catalyst metal layer that is formed on the catalyst underlying layer and whose width is narrower than that of the catalyst underlying layer, and a graphene layer growing with a sidewall of the catalyst metal layer set as a growth origin and formed to surround the catalyst metal layer.

16 Claims, 7 Drawing Sheets

(56) References Cited

U.S. PATENT DOCUMENTS

| | | | |
|---|---|---|---|
| 2007/0129481 | A1 | 6/2007 | Yamaguchi et al. |
| 2011/0006425 | A1* | 1/2011 | Wada et al. .................. 257/750 |
| 2011/0101528 | A1 | 5/2011 | Akimoto et al. |
| 2013/0134592 | A1 | 5/2013 | Yamazaki et al. |
| 2013/0140058 | A1* | 6/2013 | Kim et al. .................. 174/126.2 |
| 2013/0224914 | A1* | 8/2013 | Co et al. ......................... 438/126 |

FOREIGN PATENT DOCUMENTS

| | | |
|---|---|---|
| JP | 455695 B2 | 10/2010 |
| JP | 2012-054303 A | 3/2012 |
| JP | 5591784 B2 | 9/2014 |

OTHER PUBLICATIONS

El Mel, A. et al. Highly ordered ultralong magnetic nanowires wrapped in stacked graphene layers. Beilstein J Nanotechnol, 3, 846-851. (2012).*

Chuan Xu et al.; "Graphene Nano-Ribbon (GNR) Interconnects: A Genuine Contender or a Delusive Dream?"; IEDM Tech. Digest; University of California, Santa Barbara, CA, 93106, USA; 2008; p. 201.

K. Wakabayashi et al.; "The Electronic Physical Properties of Graphite Sheet"; The Physical Society of Japan; vol. 63; No. 5; 2008; p. 344.

Japanese Office Action dated Mar. 3, 2015, issued in counterpart Japanese Application No. 2012-208669.

* cited by examiner

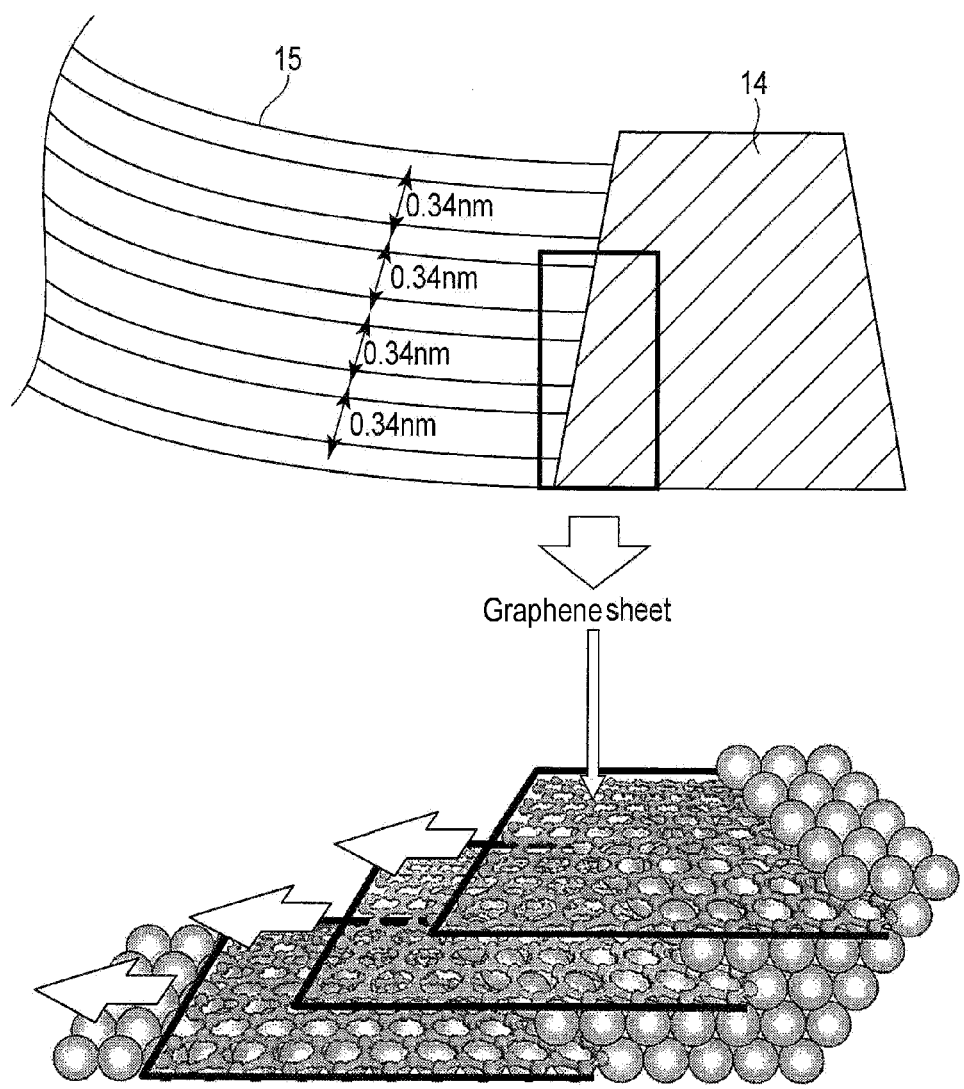
F I G. 2

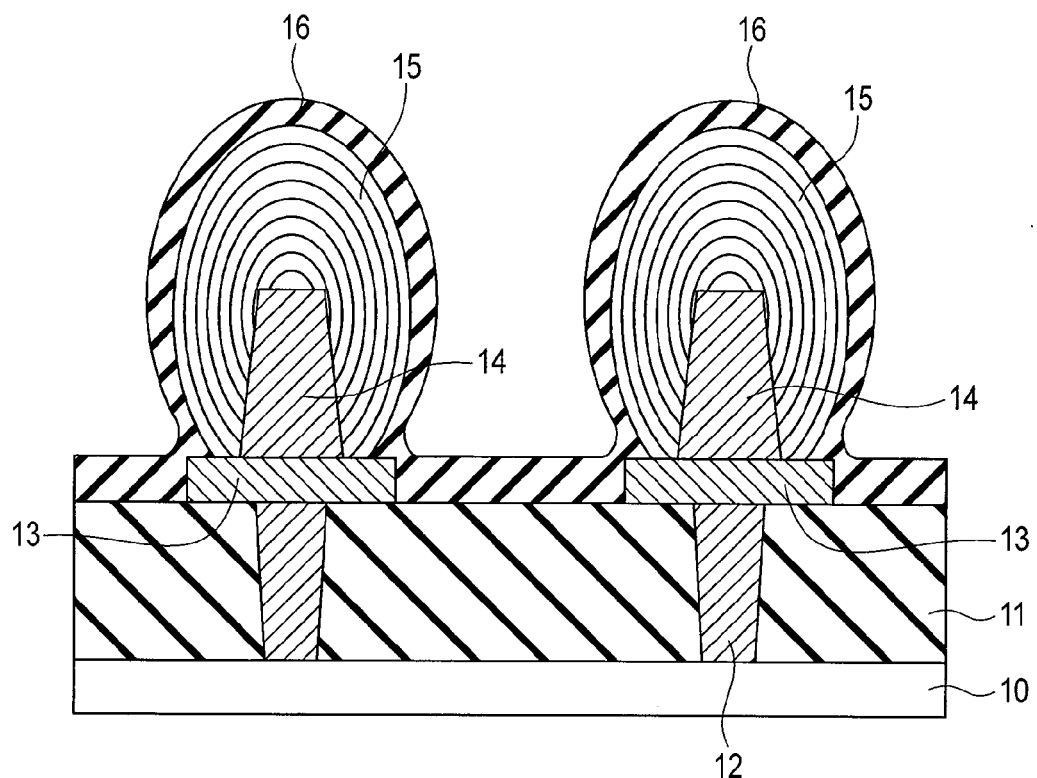
F I G. 6A
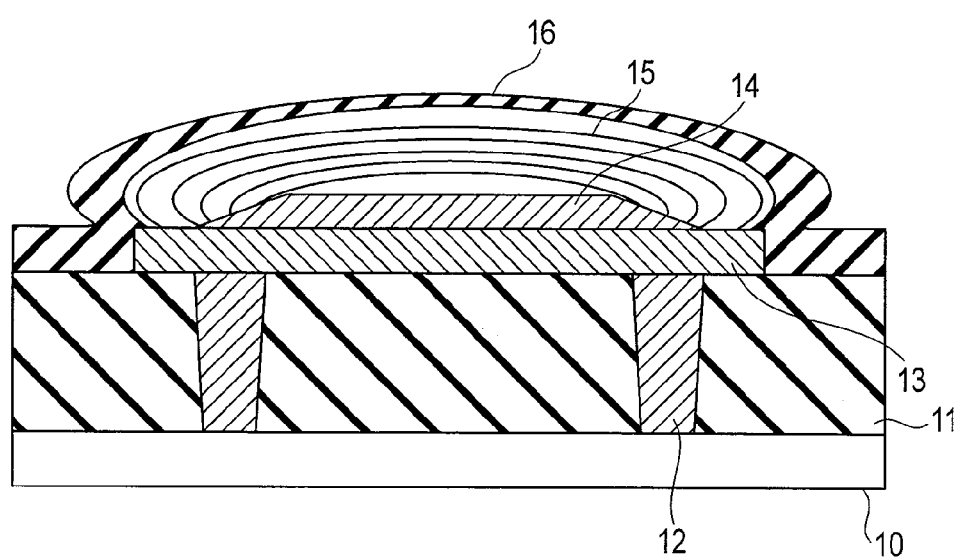
F I G. 6B

SEMICONDUCTOR DEVICE COMPRISING A GRAPHENE WIRE

CROSS-REFERENCE TO RELATED APPLICATIONS

This application is based upon and claims the benefit of priority from Japanese Patent Application No. 2012-208669, filed Sep. 21, 2012, the entire contents of which are incorporated herein by reference.

FIELD

Embodiments described herein relate generally to a semiconductor device having a graphene wiring structure.

BACKGROUND

Recently, a graphene wiring structure using graphene wires instead of metal wires has received much attention. Since graphene has a quantization-conduction characteristic (ballistic conduction characteristic) like a carbon nano-tube and conducts electricity by quantization, it is advantageous in comparison with electrical conduction of a long-distance wire. Further, the graphene wiring structure itself is an extremely thin film and can be formed by use of a CVD method. Therefore, a graphene wire has a high degree of matching with respect to a device wire formation process.

Further, graphene has a property of being able to be selectively grown from a catalyst metal. Therefore, the graphene wiring structure is preferably formed by combining the catalyst layer with graphene, and a graphene sheet preferably contains a large number (N number) of hexagon lattice structures of graphene. However, since the graphene sheet width is rate-controlled according to the width of a wire in the graphene wiring structure grown in a plane on a catalyst metal, the N number is restricted. Therefore, if the width of the wire becomes narrow and the N number decreases, the structure is strongly influenced by the edge effect on the graphene end portion. Then, modulation of the graphene band structure and scattering of carriers at the edge portion become significant and the wiring resistance increases.

BRIEF DESCRIPTION OF THE DRAWINGS

FIG. 2 is a schematic view showing the six-member ring structure of graphene sheets.

FIGS. 6A and 6B are cross-sectional views each showing the schematic structure of a semiconductor device according to a second embodiment.

DETAILED DESCRIPTION

In general, according to one embodiment, a semiconductor device comprises a catalyst underlying layer formed on a substrate including semiconductor elements formed thereon and processed in a wiring pattern, a catalyst metal layer that is formed on the catalyst underlying layer and whose width is narrower than that of the catalyst underlying layer, and a graphene layer growing with a sidewall of the catalyst metal layer set as a growth origin and formed to surround the catalyst metal layer.

A semiconductor device of the embodiment is explained below with reference to the drawings.

First Embodiment

Figure 1:
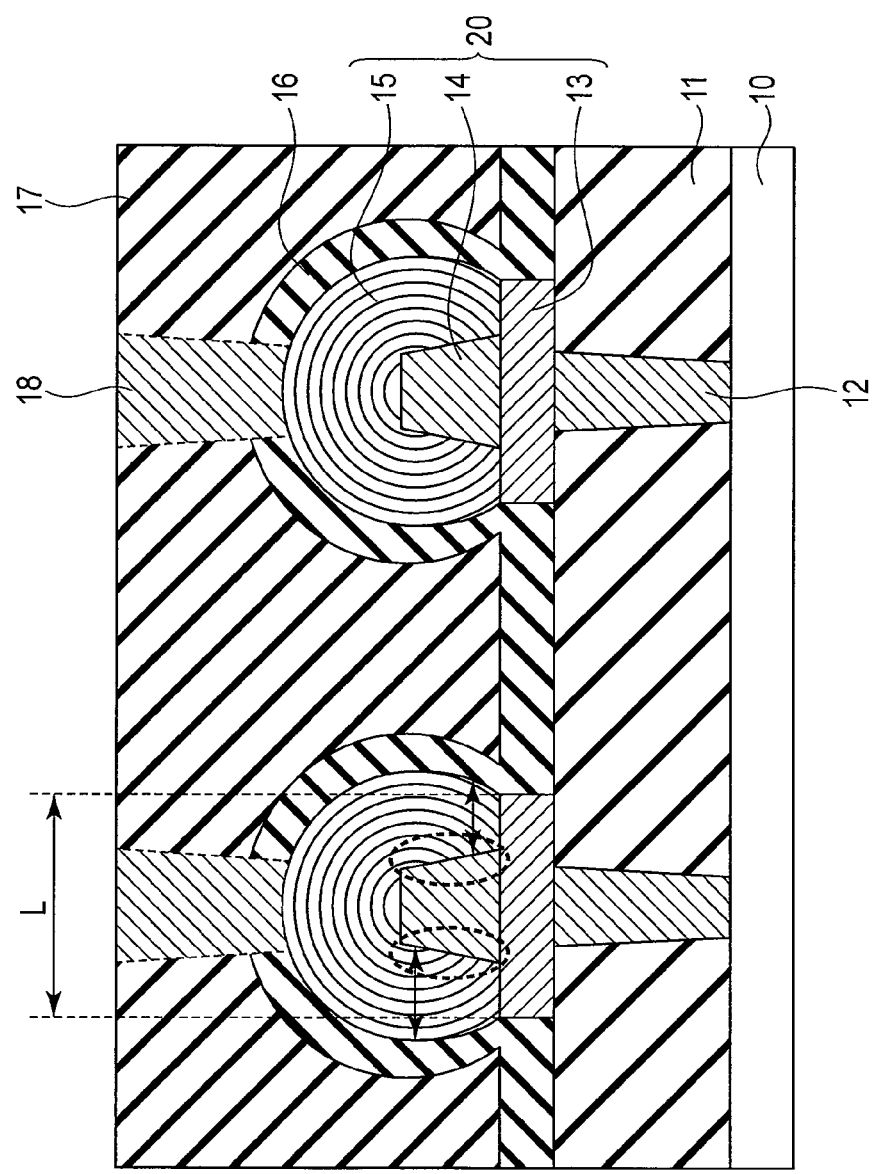
FIG. 1 is a cross-sectional view showing the schematic structure of a semiconductor device according to a first embodiment.

FIG. 1 is a cross-sectional view showing the schematic structure of a semiconductor device according to a first embodiment and particularly shows graphene wire portions.

An interlayer insulating film 11 is formed on a semiconductor substrate 10 on which elements such as transistors, capacitors and the like are formed and contact layers 12 that are formed in contact with portions of the substrate 10 are provided in the interlayer insulating film 11. Graphene wires 20 are formed on the interlayer insulating film 11 to make contact with the respective contact layers 12. Each graphene layer 20 includes an underlying metal film (catalyst underlying layer) 13 that accelerates the growth of graphene, a catalyst metal layer 14 for growing graphene and a graphene layer 15 for electrical conduction.

The catalyst underlying layer 13 is a layer that accelerates the uniform growth of the graphene layer 15 and has a function as a catalytic promoter for the growth of a graphene layer. As a typical catalyst underlying layer material, Ti, Ta, Ru, W and the nitride thereof can be used. Further, the oxide of the above metal may be used. Additionally, a stack film obtained by stacking the above films may be used. For example, the stack structure of Ti/TiN may be provided when the above films are stacked.

The catalyst metal layer 14 is a layer required for forming the graphene layer 15 and the graphene layer 15 is formed continuously to the sidewall portion of the catalyst metal layer 14. As a catalyst material, it is preferable to use a single metal of Co, Ni, Fe, Ru, Cu or the like, an alloy including at least one of the metals or a carbide of the above material.

The catalyst metal layer 14 is formed to have a narrow width in the wire width direction with respect to the catalyst underlying layer 13. The structure in which the catalyst metal layer 14 has a facet with respect to the catalyst underlying layer 13 is obtained. This is because the roll structure of the graphene layer that will be described later is formed. The catalyst metal layer 14 may be formed with the vertical structure, but is preferable in view of graphene layer formation if the layer has a tapered structure. The tapered structure indicates a trapezoidal structure in which the widths of the upper-end face and the lower-end face of the catalyst metal layer 14 are different. By forming the tapered structure, the sidewall of the catalyst metal layer is inclined with a certain angle and an infinitesimal step difference can intentionally be formed at the metal molecular level. The graphene layer can further easily grow by using the infinitesimal step difference portion as an origin. That is, the graphene wiring layer can be further easily formed. In this embodiment, the upper-end face of the tapered structure is made narrower with respect to the lower-end face, but the structure is not limited to this case and the structure in which the upper-end face is made wider with respect to the lower-end face can be provided.

Further, graphene can more easily grow from the catalyst metal side surface if the catalyst metal layer 14 has surface (111) alignment. The graphene wiring structure can easily be formed by forming a catalyst metal structure having a high-alignment (111) film on the surface (in a direction perpendicular to the drawing sheet).

The graphene layer 15 has a structure having one layer to approximately several ten layers of graphite films stacked, grows with the side surface portion of the catalyst metal layer 14 as a main origin of growth (a portion surrounded by broken lines in FIG. 1) and is formed to surround the catalyst metal layer 14. FIG. 2 shows the enlarged structure of the graphene growth origin portion. The graphene layer 15 has a structure in which the layer grows with the side surface portion of the catalyst metal layer 14 set as a main growth origin (core creation origin) and is rolled to surround the catalyst metal layer 14. The six-member ring structure of the graphene sheet is shown in FIG. 2. The graphene sheet distance is basically set to 0.34 nm.

Figure 3:
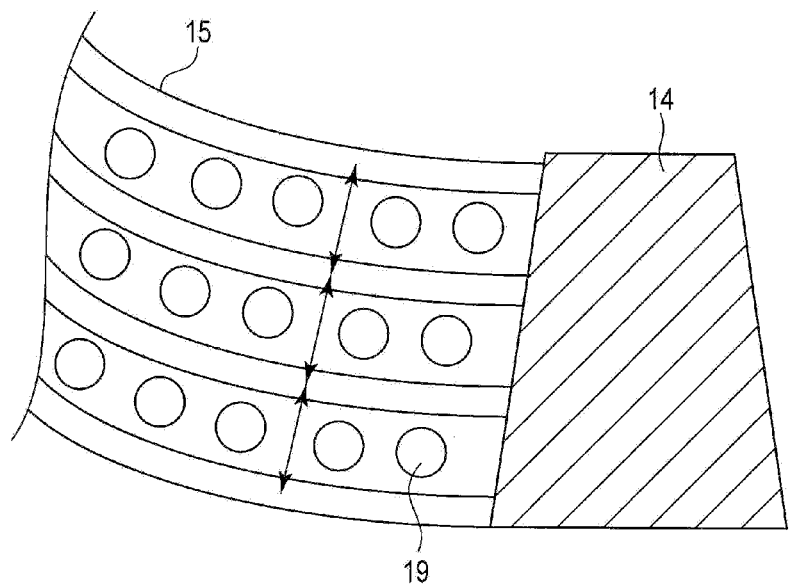
FIG. 3 is a schematic view showing the six-member ring structure of graphene sheets in which an impurity is doped.

A process gas of Br, I, $F_5As$ or the like may be introduced into a CVD gas atmosphere at the CVD film formation time of the graphene layer 15 to dope the above element into between the adjacent graphene layers 15. In this case, as shown in FIG. 3, the distance of the graphene sheets becomes larger from 0.34 nm according to the elements 19 added. Further, the electron mobility of the graphene sheet increases due to the impurity doping effect and the resistance is further lowered.

The graphene layer 15 is core-created from the infinitesimal step difference portion of the side surface of the catalyst metal layer 14. Therefore, the tapered-form catalyst metal layer structure formed with a tapered angle to easily form an infinitesimal step difference is more preferable for the growth of a graphene layer. The graphene sheets are grown from the wire side surface region in a multi-layered form and the number of stack layers of the graphene sheets is basically determined according to the height of the catalyst metal layer 14. That is, the number of stack layers of the graphene layer 15 can be increased by increasing the height of the catalyst metal layer 14. Since the respective graphene sheets of the graphene layer 15 can contribute to electrical conduction, the wiring resistance can be lowered by increasing the number of stack layers.

The roll width of the graphene layer 15 is controlled by a facet portion according to a difference in the width of the catalyst underlying layer 13 and the catalyst metal layer 14. The roll-form graphene structure is expanded to the wire end face on the side of the catalyst underlying layer 13 with a large width and the width of a portion of the graphene layer that makes contact with the catalyst underlying layer 13 will not become larger than the width of the catalyst underlying layer 13. Therefore, the graphene roll width is controlled according to width L of the catalyst underlying layer 13 and the layer is formed not to be shorted with the adjacent wire.

The average free path of electrons in the graphene layer 15 is approximately 100 nm to 1 μm. This is much longer in comparison with the average free path: approximately 40 nm of electrons in a low-resistance metal material Cu used at present in an LSI device. Therefore, the graphene layer 15 is used as a low-resistance material in an electron conduction layer of the wire by utilizing quantization conduction.

Since the graphene layer 15 is formed in a roll form as shown in FIG. 1, cross section of the graphene sheets becomes as circular. Since not only the width of the wire but also the height of the wire can function as the graphene sheet width, the number (N number) of hexagonal lattice structures of the graphene sheets can be increased without being restricted by the wire width. As a result, the influence by the edge scattering effect on the resistance of the graphene end portion can be reduced and a graphene wiring structure exhibiting low resistance even with minute wire width can be realized. Particularly, a significant effect can be obtained in the wire of 30 nm or less in which the wire width becomes minute. The resistance of the inner graphene sheet whose width is small is high and the resistance of the graphene sheet that lies on the outer peripheral side and whose width is large is made lower.

Figure 4:
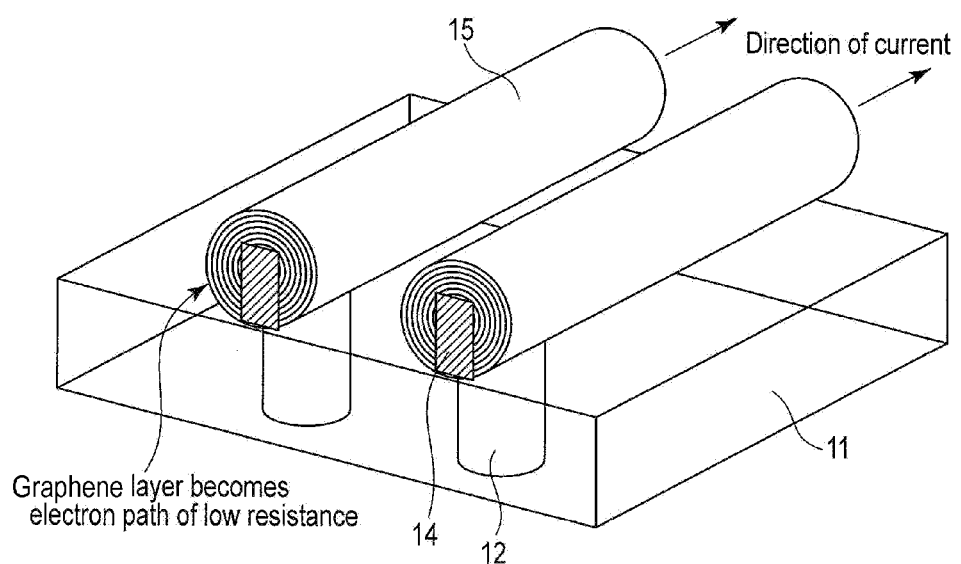
FIG. 4 is a birds-eye view showing the graphene wiring structures used in the semiconductor device of FIG. 1.

Further, as shown in the birds-eye view of FIG. 4, since the graphene layer 15 is uniformly formed around the catalyst metal layer 14, the graphene layer 15 becomes continuous in the current flow direction. As a result, an electron path is formed in the current flow direction and a low-resistance wiring structure is realized.

Surface protection insulating films 16 are formed on the graphene wiring structures to cover graphene wires 20. For example, the surface protection insulating film 16 is formed of an SiN film and formed by a CVD method or the like. The surface protection insulating film 16 has a role of preventing a metal material used in the wiring structure from being diffused and a role of preventing oxidation of the wiring layer material including graphene. A wiring layer insulating film 17 is formed on the wiring structure and upper contact layers 18 are formed as required. When the contact layers 18 are formed in the upper layer of the wiring structure, the surface protection insulating films 16 also function as processing control stopper films of the upper-layer contact layers 18. The wiring layer insulating film 17 is an $SiO_2$ film, for example, and the upper contact layer 18 is a metal material such as W, Al, Cu or the like.

It is preferable to use Ti, Ni or the like as the sidewall material of the upper contact layer 18 to reduce the contact resistance between the graphene layer 15 and the upper contact layer 18. The above metal is a metal whose contact resistance with the graphene layer 15 is low. As shown in FIG. 1, the upper contact layer 18 may be formed in contact with the graphene layer 15 or formed to penetrate the graphene layer 15. When the upper contact layer 18 is formed to penetrate the graphene layer 15, the individual graphene sheets are directly connected to the upper contact layers 18. Therefore, the contact resistance between the graphene layer 15 and the upper contact layer 18 can be further reduced.

Next, the method for manufacturing the graphene wire portion of this embodiment is explained with reference to FIGS. 5A to 5D.

Figure 5A:
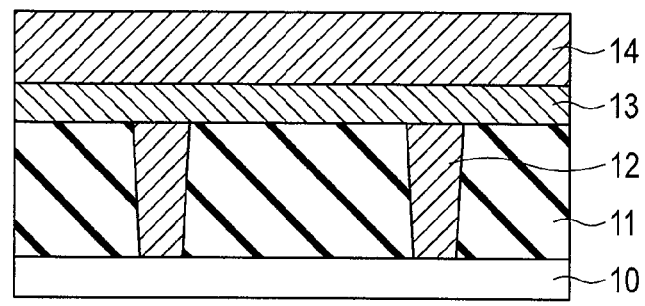
FIGS. 5A to 5D are cross-sectional views showing the manufacturing steps of the semiconductor device of FIG. 1.

First, as shown in FIG. 5A, an interlayer insulating film 11 formed of $SiO_2$ or the like is formed on a semiconductor substrate 10 having elements such as transistors and capacitors formed thereon. Then, contact holes are formed in the insulating film 11 and a metal such as W, Cu, Al or the like is filled in the contact holes to form contact layers 12.

For example, a TEOS film is used as the interlayer insulating film 11 and a single metal of W, Cu or Al, for example, is used as a conductive material of the contact. Further, the contact layer 12 may include a barrier metal layer to prevent a conductive material metal from being diffused. As the barrier metal material, for example, Ta, Ti, Ru, Mn, Co or the nitride thereof may be used.

Next, a catalyst underlying layer 13 formed of TiN, for example, is formed on the surface of the interlayer insulating film 11. Then, a catalyst metal layer 14 formed of Co, for example, is formed on the catalyst underlying layer 13. The catalyst metal layer 14 is desired to be a continuous film and the film thickness thereof is required to be set to at least 0.5 nm or more to form the continuous film. Graphene cannot smoothly grow or a graphene layer may be discontinuously formed in a state in which the catalyst metal layer 14 is dispersed and set into a fine-grain state. Therefore, it is necessary to form the catalyst metal layer 14 of such film thickness that the catalyst metal layer 14 may become a continuous film to form a uniform continuous graphene layer 15.

Figure 5B:
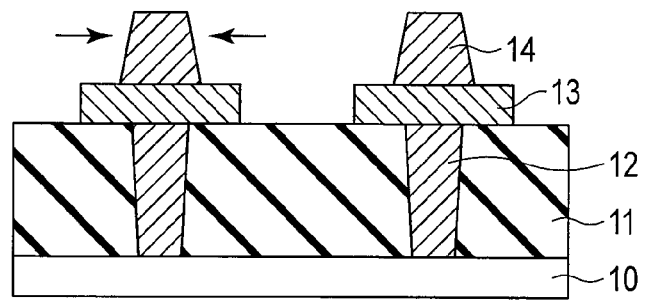

Then, as shown in FIG. 5B, the catalyst metal layer 14 and catalyst underlying layer 13 are patterned into a wiring pattern by an RIE process or Wet process via a resist coating-lithography process that is not shown in the drawing. At this time, the RIE process or Wet process is performed to set the width of the catalyst metal layer smaller than that of the catalyst underlying layer without fail and form a facet of the catalyst metal layer 14 with respect to the catalyst underlying layer 13. The RIE process is a process using Cl, Br, HBr, $H_2/O_2$, for example, and the Wet process is a process using $H_2/O_2$, HF, for example.

Figure 5C:
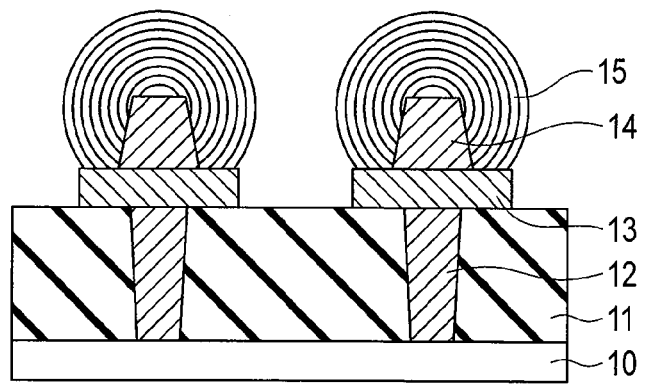

Next, a graphene layer 15 that is to be used as a wiring conduction layer is formed as shown in FIG. 5C. A CVD method is used to form the graphene layer 15. A hydrocarbon-series gas such as methane or acetylene or the mixture thereof is used as a carbon source and a rare gas or hydrogen is used as a carrier gas. Graphene can be grown in the CVD film formation process in the single condition using the above component gas. However, a multi-stage growth method obtained by devising the CVD film formation method may be more preferably used to make it possible to lower the film formation temperature or enhance the quality (uniform growth). The formation temperature lowering process is important for formation of the whole LSI device and the upper limit of the process temperature varies depending on the device, but the process temperature is preferably set lower. Further, the graphene quality enhancing process (uniform growth process) is important to easily attain electrical conduction and realize a low-resistance wire. As a result, graphene grows from the side surface of the catalyst metal layer 14 and the graphene layer 15 is formed in a roll form to surround the catalyst metal layer 14.

The outline of the growth method is as follows. First, a plasma process is performed to suppress cohesion with respect to fine grains of the catalyst metal layer 14. The uniform growth of graphene is accelerated by preventing the catalyst metal layer 14 from being formed into fine grains by performing the plasma process and maintaining the continuity of the catalyst film surface. Hydrogen or a rare gas is preferably used as a discharge gas, but the mixture thereof including one or both of the gases may be used. A better effect can be attained when the process temperature is set as low as possible and it is desirable to set the process temperature to room temperature. Further, it is preferable to set relatively intense plasma and the effect can be further enhanced by exposing the layer to plasma or using high-power remote plasma.

Next, the catalyst metal layer 14 is carbonized. A hydrocarbon-series gas such as methane or acetylene or the mixture thereof is used as the discharge gas. It is necessary to perform the process at a temperature lower than the temperature at which graphene is formed in the final step and the graphene layer 15 can be formed and it is preferable to set the temperature to approximately 150 to 600° C. Further, the process time may be set short. It is also preferable to use relatively intense plasma for the process.

Subsequently, the plasma process is performed to enhance the carbide layer quality and activate the catalyst layer. It is preferable to use a rare gas as the discharge gas. The temperature may be set between the temperatures in the preceding step and the next processing step. Since the process may be performed by use of relatively weak plasma, remote plasma may be preferably used.

Finally, graphene is formed. A hydrocarbon-series gas or the mixture thereof is used as the discharge gas. The upper limit of the process temperature is approximately 1000° C. and the lower limit is approximately 200° C. If the temperature becomes lower than 200° C., a satisfactory growth rate cannot be attained and graphene growth hardly occurs, but graphene growth occurs at the process temperature of approximately 200° C. and a uniform graphene film can be formed. It is particularly preferable to set the growth temperature to approximately 350° C. The graphene growth temperature is equivalent to or lower than the wire formation temperature of a normal LSI device and a growth method having an excellent affinity for the semiconductor process can be attained. Since it is important to remove ions and electrons and supply only radicals to the substrate, it is desirable to remotely use extremely weak plasma. Further, it is also effective to set an electrode on the upper portion of the substrate and apply a voltage thereto to remove ions and electrons. The application voltage is preferably set from 0 to approximately ±100 V.

Figure 5D:
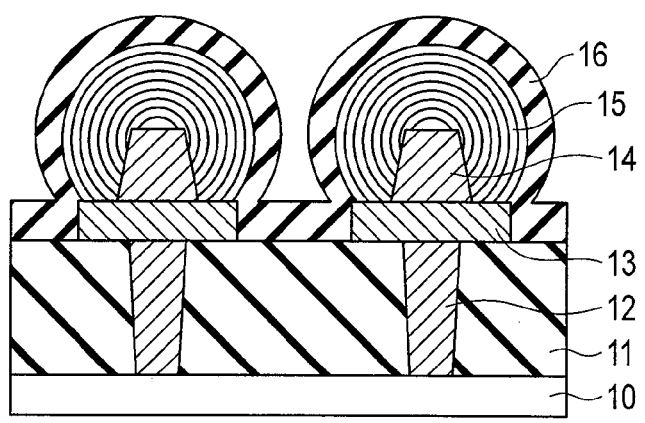

Next, as shown in FIG. 5D, a surface protection insulating film 16 is formed on the interlayer insulating film 11 to cover the graphene layers 15. The surface protection insulating film 16 is formed of an SiN film and formed by use of a CVD method or the like. A wiring layer insulating film 17 is formed thereon to complete the wiring structure. The wiring layer insulating film 17 is formed of a TEOS film, for example, and formed by use of a CVD method or the like. Next, when contacts are connected to the upper layer of the wiring structure, contact holes are formed by use of a resist coating-lithography process that is not shown in the drawing. Then, a metal material film of W, Cu or Al, for example, is formed to complete an upper-layer contact layer 18. The method described above is a manufacturing method of the structure of this embodiment.

Thus, in this embodiment, the graphene layer 15 is grown from the side surface portion of the catalyst metal layer 14 and the wiring structure of the graphene layer 15 formed to surround the catalyst metal layer 14 can be realized. In this case, since the graphene layer 15 is formed to surround the catalyst metal layer 14 with the side surface of the catalyst metal layer 14 used as a growth origin, a large N number of graphene sheets can be provided. Additionally, since the graphene sheets are continuous in the wiring direction (that is, the electron conduction direction), the low-resistance wiring structure can be formed.

That is, the N number is not largely restricted by the width of the catalyst underlying layer 13 used as the underlying wire, the N number of graphene sheets can be set large, and as a result, a low-resistance wire can be realized even if the width of the wire decreases. Further, since the end face of the graphene sheet makes contact with the catalyst metal layer 14 or catalyst underlying metal 13, scattering of electrons on the graphene end face can be suppressed and the resistance can be further lowered.

The graphene layer 15 can easily be grown from the side surface of the catalyst metal layer by setting the surface alignment azimuth of the catalyst metal layer 14 to high (111) alignment and, as a result, a graphene wiring structure can easily be formed.

Second Embodiment

FIGS. 6A, 6B are cross-sectional views each showing the schematic structure of a semiconductor device according to a second embodiment and particularly shows graphene wire portions. The same symbols are attached to the same portions as those of FIG. 1 and the detailed explanation thereof is omitted.

The basic configuration is the same as that of the first embodiment and the present embodiment is different from the first embodiment described before in the shapes of the catalyst metal layer 14 and graphene layer 15. The shape of a graphene wire 20 can be changed according to the height of the catalyst metal layer 14. For example, as shown in FIG. 6A, a graphene wiring structure expanded into an elliptical form in the wire height direction can be formed by increasing the height of the catalyst metal layer 14 and increasing the number of graphene stack layers.

Thus, the height of the catalyst metal layer 14 is increased and the number of stack layers of the graphene sheets is increased thereby to form a conduction path in a more multiple layer form and lower the resistance. At the same time, the N number of graphene sheets can be increased and the influence of the edge scattering effect on the resistor at the graphene end portion can be reduced.

Further, as shown in FIG. 6E, the graphene layer 15 can be formed in an elliptical form expanded in the wire width direction by decreasing the height of the catalyst metal layer 14 and increasing the width thereof. The structure can be effectively used when a wire with large width is formed.

Third Embodiment

Figure 7:
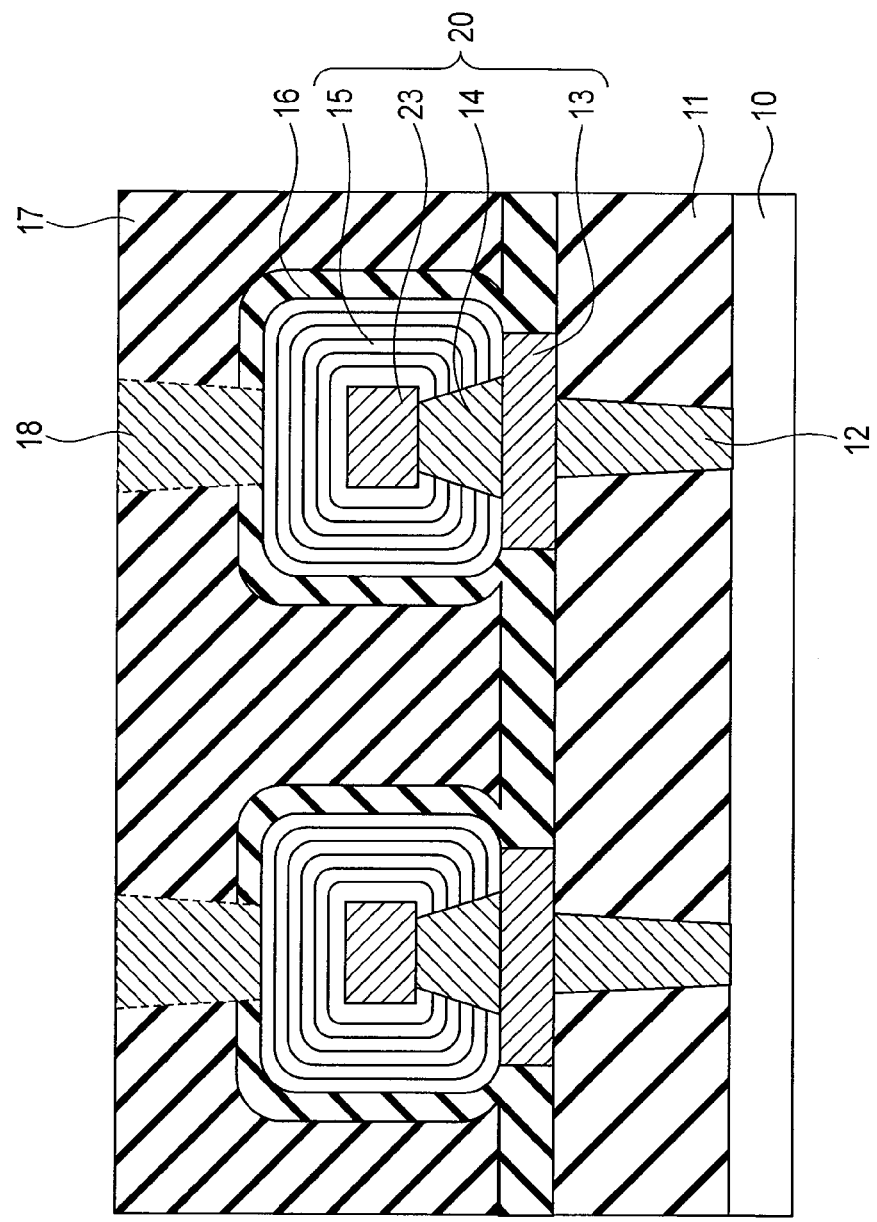
FIG. 7 is a cross-sectional view showing the schematic structure of a semiconductor device according to a third embodiment.

FIG. 7 is a cross-sectional view showing the schematic structure of a semiconductor device according to a third embodiment and particularly shows graphene wire portions. The same symbols are attached to the same portions as those of FIG. 1 and the detailed explanation thereof is omitted.

The present embodiment is different from the first embodiment described before in that the thickness of the graphene layer 15 is increased in the vertical direction by further forming a metal film on each catalyst metal layer 14.

The basic configuration is the same as that of FIG. 1, and additionally, in this embodiment, a metal film 23 having a width larger than that of the catalyst metal layer 14 is formed on each catalyst metal layer 14. In this case, as the metal film 23, a metal material that is a material of high RIE processability and on which graphene is more difficult to grow than on the catalyst metal layer 14 may be used. For example, a metal material of Ti, Ta, Ru or W or the nitride thereof can be used. Each graphene layer 15 is formed in a roll form to surround the catalyst metal layer 14 and metal film 23.

Thus, in this embodiment, since the height of a core material that is rolled in graphene is increased and the N number of graphene sheets can be increased by forming the metal film 23 on the catalyst metal layer 14 in addition to the structure of the first embodiment, a wire with lower resistance can be realized.

Further, since the catalyst metal layer 14 itself is a metal film, the layer can be used as an electrical conduction path. The wire resistance can be further lowered by using a combination of the graphene layers 15 and catalyst metal layer 14 as an electrical conduction layer. In the structure of FIG. 7, if a metal material of low resistance is used as the metal film 23 formed on the catalyst metal layer 14, a corresponding region can also be effectively used as the electrical conduction path.

Next, a manufacturing method of the graphene wire portion of this embodiment is explained with reference to FIGS. 8A to 8C.

Figure 8A:
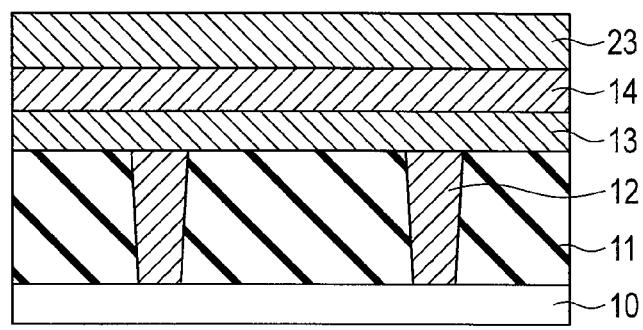
FIGS. 8A to 8C are cross-sectional views showing the manufacturing steps of the semiconductor device of FIG. 7.

First, as shown in FIG. 8A, like the first embodiment, an interlayer insulating film 11 and contact layers 12 are formed on a semiconductor substrate 10 having elements such as transistors and capacitors formed thereon. Then, a TiN film used as a catalyst underlying layer (first metal film) 13 is formed on the above structure and a catalyst metal layer 14 is further formed on the above film. Then, a Ti film used as a second metal film 23 is formed on the catalyst metal layer 14.

Figure 8B:
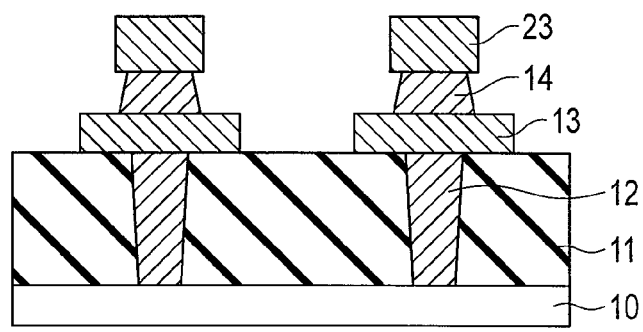
Figure 8C:
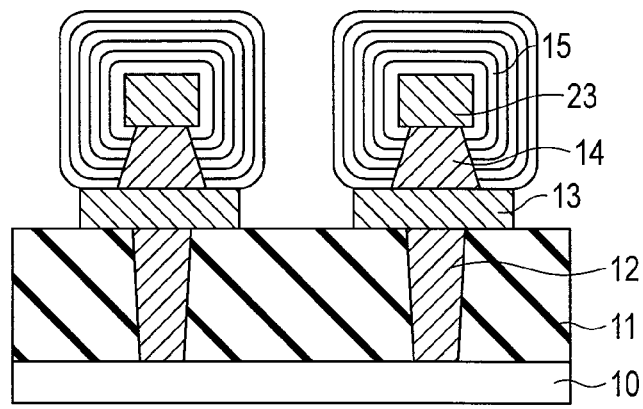

Next, as shown in FIG. 8B, a mask (not shown) of the wiring pattern is formed on the second metal film 23 and then the second metal film 23, catalyst metal layer 14 and first metal film 13 are selectively etched by use of an RIE process using the mask.

Subsequently, the catalyst metal layer 14 is side-etched by wet etching or dry etching with the mask left behind. As a result, the width of the catalyst metal layer 14 is made narrower than that of the first metal film 13. At this time, the second metal film 23 is also side-etched by a lower amount than that of the catalyst metal layer 14 and the width thereof may be narrower than that of the first metal film 13.

Next, a graphene layer 15 is grown by use of a CVD method after the mask is removed. The source gas, growth condition and the like are the same as those of the first embodiment. As a result, as shown in FIG. 8C, graphene grows from the side surface of the catalyst metal layer 14 and the graphene layer 15 is formed in a roll form to surround the catalyst metal layer 14 and second metal film 23.

After this, a surface protection insulating film 16 and wiring layer insulating film 17 are formed and contact layers 18 are formed to complete the structure shown in FIG. 7. If it is unnecessary to connect the structure to upper-layer wires, the contact layers 18 are unnecessary.

Thus, according to this embodiment, since the second metal film 23 is formed on the catalyst metal layer 14 and the graphene layer 15 is formed to surround the above layers, the thickness (height) of the graphene layer 15 is increased more in comparison with that of the first embodiment. Therefore, it becomes possible to further increase the N number of graphene sheets and the resistance of the graphene wire can be further lowered.

Modification

This invention is not limited to the above embodiments.

Materials of the catalyst metal layer for growing graphene, the catalyst underlying layer (first metal film) and the second metal film are not limited to those explained in the embodiments and can be adequately changed according to the specification. Further, the thickness of the catalyst metal layer may be determined according to the number of required layers of the graphene layer.

Further, the manufacturing method explained in the embodiment is given only as one example and can be adequately changed. For example, the conditions of the temperature, source gas and the like for forming the graphene layer are not limited to the conditions explained in the above embodiments and can be adequately changed according to the specification. The other film formation methods are not limited at all. That is, this invention is featured in the structure finally formed and the manufacturing method is not limited at all.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a catalyst underlying layer formed on a substrate including semiconductor elements formed thereon, the catalyst underlying layer being processed in a wiring pattern,
a catalyst metal layer formed on the catalyst underlying layer, the catalyst metal layer having a width narrower than that of the catalyst underlying layer, and
a graphene layer formed to surround a plurality of sides including an upper surface of the catalyst metal layer, terminal ends of the graphene layer being in direct contact with a side surface of the catalyst metal layer such that the graphene layer and the side surface of the catalyst metal layer form an oblique or orthogonal angle.

2. The device of claim 1, wherein a facet is formed on the side surface of the catalyst metal layer and the terminal ends of the graphene layer are in contact with the facet of the catalyst metal layer.

3. The device of claim 2, wherein the catalyst metal layer is formed in a tapered form whose widths of upper and lower surfaces are different, and the catalyst metal layer has surface (111) alignment.

4. The device of claim 3, wherein the width of the upper surface of the catalyst metal layer is narrower than the width of the lower surface.

5. The device of claim 1, wherein the graphene layer is formed in a shape of a roll.

6. The device of claim 5, wherein the width of the catalyst underlying layer is set according to a required roll diameter of the graphene layer.

7. A semiconductor device comprising:
a first metal film formed on a substrate including semiconductor elements formed thereon, the first metal film being processed in a wiring pattern,
a catalyst metal layer formed on the first metal film, the catalyst metal layer having a width narrower than that of the first metal film,
a second metal film formed on the catalyst metal layer, and
a graphene layer formed to surround a plurality of sides including an upper surface of the catalyst metal layer and a plurality of sides of the second metal film, terminal ends of the graphene layer being in direct contact with a side surface of the catalyst metal layer such that the graphene layer and the side surface of the catalyst metal layer form an oblique or orthogonal angle.

8. The device of claim 7, wherein a facet is formed on the side surface of the catalyst metal layer and the terminal ends of the graphene layer are in contact with the facet of the catalyst metal layer.

9. The device of claim 7, wherein the catalyst metal layer is formed in a tapered form whose widths of upper and lower surfaces are different, and the catalyst metal layer has surface (111) alignment.

10. The device of claim 9, wherein the width of the upper surface of the catalyst metal layer is narrower than the width of the lower surface.

11. The device of claim 7, wherein the graphene layer is formed in a shape of a roll.

12. The device of claim 11, wherein the width of the first metal film is set according to a required roll diameter of the graphene layer.

13. The device of claim 7, wherein a width of the second metal film is narrower than the width of the first metal film and wider than the width of the catalyst metal layer.

14. A semiconductor device comprising:
a catalyst underlying layer formed on a substrate including semiconductor elements formed thereon, the catalyst underlying layer being processed in a wiring pattern,
a catalyst metal layer formed on the catalyst underlying layer, the catalyst metal layer having a width narrower than that of the catalyst underlying layer, being formed in a tapered form whose widths of upper and lower surfaces are different, having surface (111) alignment and having a side surface on which a facet is formed, and
a graphene layer formed in a shape of a roll to surround the catalyst metal layer, the graphene layer growing with the facet of the catalyst metal layer set as a growth origin.

15. The device of claim 14, wherein the width of the upper surface of the catalyst metal layer is narrower than the width of the lower surface.

16. The device of claim 14, wherein the width of the catalyst underlying layer is set according to a required roll diameter of the graphene layer.

* * * * *